(12) United States Patent
Liang et al.

(10) Patent No.: US 9,653,418 B2
(45) Date of Patent: *May 16, 2017

(54) PACKAGING DEVICES AND METHODS

(71) Applicant: Taiwan Semiconductor Manufacturing Company, Ltd., Hsin-Chu (TW)

(72) Inventors: Shih-Wei Liang, Dajia Township (TW); Kai-Chiang Wu, Hsi-Chu (TW); Ming-Che Ho, Tainan (TW); Yi-Wen Wu, Xizhi (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/709,076

(22) Filed: May 11, 2015

(65) Prior Publication Data

US 2015/0243615 A1 Aug. 27, 2015

Related U.S. Application Data

(63) Continuation of application No. 13/623,502, filed on Sep. 20, 2012, now Pat. No. 9,030,010.

(51) Int. Cl.
*H01L 23/00* (2006.01)
*H01L 23/498* (2006.01)
(Continued)

(52) U.S. Cl.
CPC .......... *H01L 24/11* (2013.01); *H01L 21/2855* (2013.01); *H01L 21/30604* (2013.01); *H01L 21/30625* (2013.01); *H01L 21/486* (2013.01); *H01L 21/4853* (2013.01); *H01L 21/76879* (2013.01); *H01L 21/76898* (2013.01); *H01L 23/481* (2013.01); *H01L 23/49816* (2013.01);
(Continued)

(58) Field of Classification Search
CPC ......... H01L 24/11; H01L 24/13; H01L 24/16; H01L 24/73; H01L 21/2855; H01L 21/30604; H01L 21/30625; H01L 21/4853; H01L 21/486; H01L 21/76879; H01L 21/76898; H01L 23/481; H01L 23/49816; H01L 23/49827; H01L 25/105
See application file for complete search history.

(56) References Cited

U.S. PATENT DOCUMENTS

| | | | |
|---|---|---|---|
| 5,762,259 A | 6/1998 | Hubacher et al. | |
| 7,892,929 B2 | 2/2011 | Chen et al. | |
| 8,466,553 B2 * | 6/2013 | Cheng | H01L 24/05 257/734 |
| 2002/0036066 A1 | 3/2002 | Ogawa et al. | |
| 2002/0195171 A1 | 12/2002 | Li et al. | |
| 2008/0132016 A1 | 6/2008 | Lee | |
| 2010/0038803 A9 | 2/2010 | Lee et al. | |
| 2010/0140772 A1 * | 6/2010 | Lin | H01L 21/486 257/686 |
| 2010/0140805 A1 | 6/2010 | Chang et al. | |
| 2010/0171197 A1 * | 7/2010 | Chang | H01L 21/6835 257/621 |
| 2010/0276796 A1 | 11/2010 | Andry et al. | |
| 2011/0278736 A1 | 11/2011 | Lin et al. | |
| 2012/0217629 A1 * | 8/2012 | Cho | H01L 25/16 257/692 |
| 2012/0217645 A1 | 8/2012 | Pagaila | |
| 2012/0218645 A1 | 8/2012 | Yoshimi | |

(Continued)

FOREIGN PATENT DOCUMENTS

CN 101752336 6/2010

*Primary Examiner* — Whitney T Moore
(74) *Attorney, Agent, or Firm* — Slater Matsil, LLP (57) ABSTRACT

A method of manufacturing a packaging device may include: forming a plurality of through-substrate vias (TSVs) in a substrate, wherein each of the plurality of TSVs has a protruding portion extending away from a major surface of the substrate. A seed layer may be forming over the protruding portions of the plurality of TSVs, and a conductive ball may be coupled to the seed layer and the protruding portion of each of the plurality of TSVs. The seed layer and the protruding portion of each of the plurality of TSVs may extend into an interior region of the conductive ball.

20 Claims, 6 Drawing Sheets

(51) Int. Cl.
   *H01L 23/48*      (2006.01)
   *H01L 21/285*     (2006.01)
   *H01L 21/48*      (2006.01)
   *H01L 21/306*     (2006.01)
   *H01L 21/768*     (2006.01)
   *H01L 25/10*      (2006.01)

(52) U.S. Cl.
   CPC ........ *H01L 23/49827* (2013.01); *H01L 24/13* (2013.01); *H01L 25/105* (2013.01); *H01L 24/16* (2013.01); *H01L 24/73* (2013.01); *H01L 2224/023* (2013.01); *H01L 2224/0401* (2013.01); *H01L 2224/1162* (2013.01); *H01L 2224/11334* (2013.01); *H01L 2224/11849* (2013.01); *H01L 2224/13024* (2013.01); *H01L 2224/13025* (2013.01); *H01L 2224/16238* (2013.01); *H01L 2224/32145* (2013.01); *H01L 2224/48227* (2013.01); *H01L 2224/73265* (2013.01); *H01L 2224/81192* (2013.01); *H01L 2225/1023* (2013.01); *H01L 2225/1058* (2013.01); *H01L 2924/01322* (2013.01); *H01L 2924/15311* (2013.01); *H01L 2924/15331* (2013.01); *H01L 2924/181* (2013.01); *H01L 2924/18161* (2013.01); *H01L 2924/2064* (2013.01)

(56) References Cited

U.S. PATENT DOCUMENTS

2013/0154112 A1  6/2013  Zhang et al.
2014/0252475 A1  9/2014  Xu

\* cited by examiner

PACKAGING DEVICES AND METHODS

PRIORITY CLAIM AND CROSS-REFERENCE

This application is a continuation of U.S. patent application Ser. No. 13/623,502, filed Sep. 20, 2012, entitled "Packaging Devices and Methods," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller packaging technique for semiconductor devices that has been recently developed is package-on package (PoP) devices, wherein two or more integrated circuit dies are packaged separately and the packaged integrated circuit dies are coupled together in a single PoP device.

BRIEF DESCRIPTION OF THE DRAWINGS

For a more complete understanding of the present disclosure, and some advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packaging devices and methods for semiconductor devices. Novel packaging methods, devices, and methods of coupling solder balls to a packaging substrate will be described herein.

FIGS. 1 through 6 are cross-sectional views of a packaging device 100 at various stages of manufacturing, illustrating a method of manufacturing the packaging device 100 in accordance with some embodiments of the present disclosure.

The manufacturing method for the packaging device 100 includes first, providing an interposer substrate 102. Note that only one packaging device 100 is included in each of the drawings; however, a plurality of packaging devices 100 are simultaneously formed across a surface of an interposer substrate 102, and the individual packaging devices 100 are singulated later in the manufacturing process flow.

Figure 1:
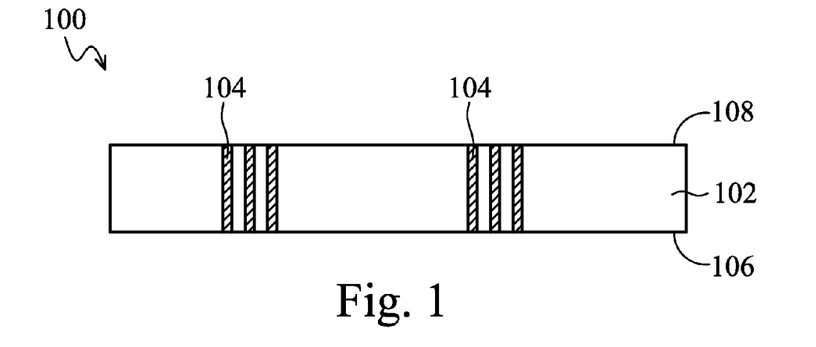
FIGS. 1 through 6 are cross-sectional views of a packaging device at various stages of manufacturing, illustrating a method of manufacturing a packaging device in accordance with some embodiments of the present disclosure.

The interposer substrate 102 includes a plurality of through-substrate vias (TSVs) 104 formed therein, as shown in FIG. 1. The TSVs 104 are conductive and provide electrical connections from a first side 106 of the interposer substrate 102 to a second side 108 of the interposer substrate 102, wherein the second side 108 is opposite the first side 106. The TSVs 104 provide vertical connections for the packaging device 100. The interposer substrate 102 may comprise silicon or other semiconductive materials, for example. Alternatively, the interposer substrate 102 may comprise other materials.

The TSVs 104 are formed by patterning or drilling a plurality of holes or apertures completely through the interposer substrate 102, and filling the holes with a conductive material. In some embodiments, the holes are formed partially through the interposer substrate 102 on one side, the holes are filled with the conductive material, and the opposite side of the interposer substrate 102 is thinned until the TSVs 104 are reached so that the TSVs 104 extend completely through the interposer substrate 102, as an example. Alternatively, the TSVs 104 may be formed in the interposer substrate 102 using other methods.

The TSVs 104 may comprise one or more liners and a fill material (not shown in the drawings) in some embodiments. The TSVs 104 may comprise one or more liners comprising Ta, TaN, Ti, TiN, other materials, or combinations or multiple layers thereof, as examples. The liner may comprise a bi-layer of Ta/TaN or Ti/TiN in some embodiments. The TSVs 104 may comprise a fill material comprising Cu disposed over the liner(s), for example. Alternatively, the TSVs 104 may comprise other materials and may not include a liner. In some embodiments, a liner comprising an insulating material is formed on sidewalls of the holes used to form the TSVs 104, before the liner(s) and fill materials are deposited or formed, for example. An insulating liner is not included in the interposer substrate 102 in other embodiments. The TSVs 104 comprise a diameter in a top view of the interposer substrate 102 of about 10 to 20 μm, as an example, although alternatively, the TSVs 104 may comprise other dimensions.

Figure 2:
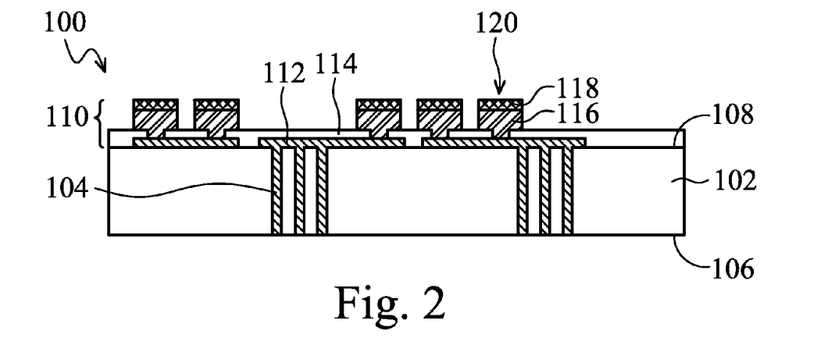

A redistribution layer (RDL) 110 is formed over the second side 108 of the interposer substrate 102, as shown in FIG. 2. The RDL 110 includes wiring 112 disposed within an insulating material 114. The wiring 112 comprises a plurality of traces of conductive material such as Cu, Al, other metals, or multiple layers or combinations thereof, as examples. The insulating material 114 comprises silicon dioxide, silicon nitride, other insulators, or multiple layers or combinations thereof, as examples. Alternatively, the wiring 112 and insulating material 114 may comprise other materials. At least some of the wiring 112 is coupled to the TSVs 104 to provide electrical connections for the second side 108 of the packaging device 100. Portions of the wiring 112 may comprise fan-out regions of wiring for the electrical connections of the packaging device 100 in some embodiments, for example.

The RDL 110 includes a plurality of contacts 120 disposed on the surface thereof. The contacts 120 include a first conductive material 116 and a second conductive material 118 disposed over the first conductive material 116. The first conductive material 116 comprises Cu and the second conductive material 118 comprises Sn in some embodiments. Alternatively, the contacts 120, the first conductive material 116, and the second conductive material 118 may comprise other materials. The second conductive material 118 is not included in some embodiments. At least some of the contacts 120 are coupled to the wiring 112 of the RDL 110 through the insulating material 114. The RDL 110 provides horizontal connections for the packaging device 100.

The various portions of the RDL 110, i.e., the wiring 112, the insulating material 114, and the contacts 120 of the RDL 110, may be formed using subtractive etch techniques, damascene techniques, and/or other methods, as examples.

Figure 3:
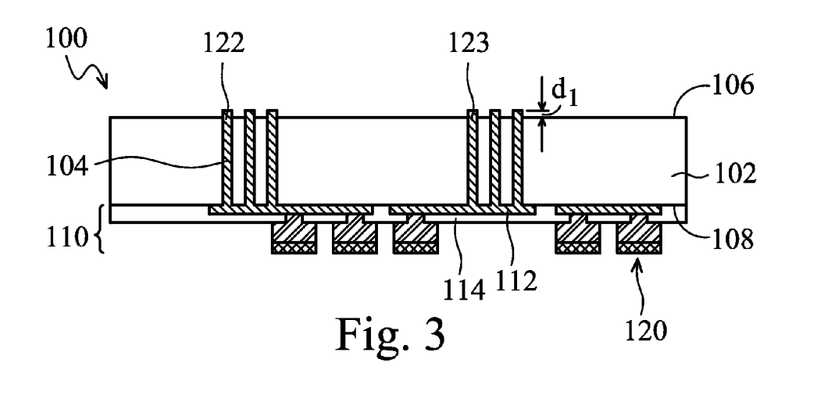

In accordance with some embodiments of the present disclosure, the interposer substrate 102 is recessed to expose portions 122 of the plurality of TSVs 104, as illustrated in FIG. 3. Portions 122 of the TSVs 104 are also referred to herein as top portions 122 and exposed portions 122, as examples. For example, the interposer substrate 102 is inverted so that the first side 106 is facing upwards, and an etch process is used to remove a portion of the top surface of the interposer substrate 102 and expose the top portions 122 of the TSVs 104. In other embodiments, a chemical-mechanical polish (CMP) process is used to remove a portion of the top surface of the interposer substrate 102, exposing the top portions 122 of the TSVs 104. A combination of an etch process and a CMP process may also be used to recess the interposer substrate 102 to expose portions 122 of the plurality of TSVs 104, for example.

In other embodiments, a thickness of the TSVs 104 is increased so that the top surface of the interposer substrate 102 is recessed beneath top surfaces of the TSVs 104. The thickness of the TSVs 104 may be increased by a plating process, for example. Initially, the top surface 123 of the TSVs 104 may be substantially coplanar with the top surface of the interposer substrate 102, as shown in phantom in FIG. 3. Conductive material such as Cu is plated onto the initial coplanar top surfaces 123 to form the portions 122 of the TSVs 104 that extend upwardly away from the top surface of the interposer substrate 102. The conductive material is plated onto the conductive TSVs 104, but not onto the top surface of the interposer substrate 102 in the plating process. In other embodiments, the thickness of the TSVs 104 is increased using a deposition process. For example, additional conductive material can be deposited over the first side 106 of the interposer substrate 102, and the conductive material can be patterned using lithography or a direct patterning method to remove the conductive material from the top surface of the first side 106 of the interposer substrate 102, leaving the conductive material over the TSVs 104 and increasing the thickness of the TSVs 104 so that the top exposed portions 122 of the TSVs 104 extend upwardly away from the top surface of the interposer substrate 102. A combination of a deposition method and a plating method may also be used so that top portions 122 of the TSVs 104 are exposed above the first side 106 of the interposer substrate 102. Alternatively, the thickness of the TSVs 104 may be increased using other methods.

In some embodiments, the thickness of the TSVs 104 is increased, and the interposer substrate 102 is also recessed, using one or more of the methods described herein, to expose the top portions 122 of the TSVs 104, for example.

After recessing the interposer substrate 102 and/or increasing a thickness of the plurality of TSVs 104, the exposed portions 122 of the TSVs 104 extend away from the top surface of the interposer substrate 102 by an amount comprising dimension $d_1$, wherein $d_1$ comprises about 10 to 20 μm, as an example. In some embodiments, dimension $d_1$ comprises about 30 μm or less, for example. Alternatively, dimension $d_1$ may comprise other values, depending on a variety of factors, such as the particular application, a desired size of conductive balls 140 (not shown in FIG. 3; see FIG. 5), or a desired stand-off height (e.g., away from a surface the conductive balls 140 are eventually attached to in an end application), and other factors, as examples. Dimension $d_1$ also represents an amount that the top surface of the interposer substrate 102 is recessed below the top surface of the exposed portions 122 of the TSVs 104, for example. The TSVs 104 comprise exposed TSVs (eTSVs) having ends that protrude from the surface of the interposer substrate 102 by dimension $d_1$ comprising about 10 to 20 μm in some embodiments, as another example.

Figure 4:
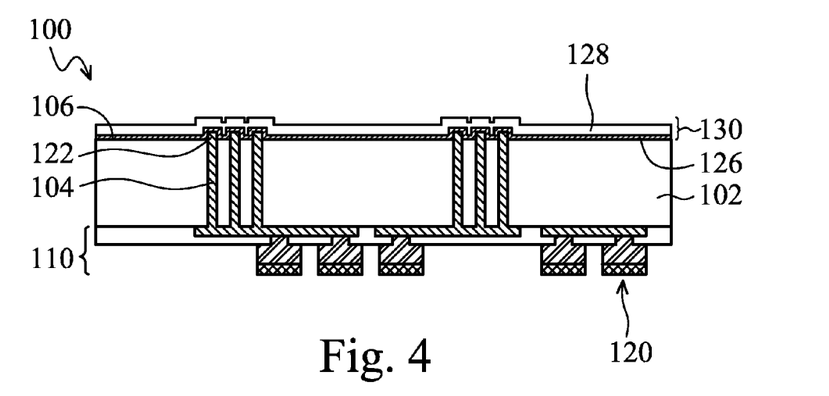

A seed layer 130 is then formed over the exposed portions 122 of the TSVs 104 and over the top surface of the first side 106 of the interposer substrate 102, as shown in FIG. 4. Note that after the seed layer 130 is formed over the exposed portions 122 of the TSVs 104, the TSVs 104 are not actually "exposed" anymore; rather, the TSVs 104 are covered by the seed layer 130. However, purposes of discussion herein, to be consistent, the exposed portions 122 of the TSVs 104 are continued to be referred to throughout the remainder of the present disclosure as "exposed portions 122", because they were exposed in the previous manufacturing process step.

In some embodiments, the seed layer 130 comprises two layers: a first layer 126 and a second layer 128 disposed over the first layer 126, as shown in FIG. 4. The first layer 126 comprises about 1,000 to 3,000 Angstroms of Ti and the second layer 128 comprises about 5,000 to 10,000 Angstroms of Cu in some embodiments, as an example. Alternatively, the first layer 126 and the second layer 128 of the seed layer 130 may comprise other materials and dimensions. The seed layer 130 may alternatively comprise a single material layer or three or more material layers, as examples. One or more layers 126 or 128 of the seed layer 130 are formed using a sputter process in some embodiments. The seed layer 130 may alternatively be formed using other methods. The seed layer 130 is substantially conformal over the surface of the interposer substrate 126 and conforms to the topography of the exposed portions 122 of the TSVs 104 in some embodiments, for example. Alternatively, the seed layer 130 may be non-conformal, not shown in the drawings. Note that in order to simplify the drawings, the seed layer 130 is shown as a single layer in subsequent drawings herein.

Figure 5:
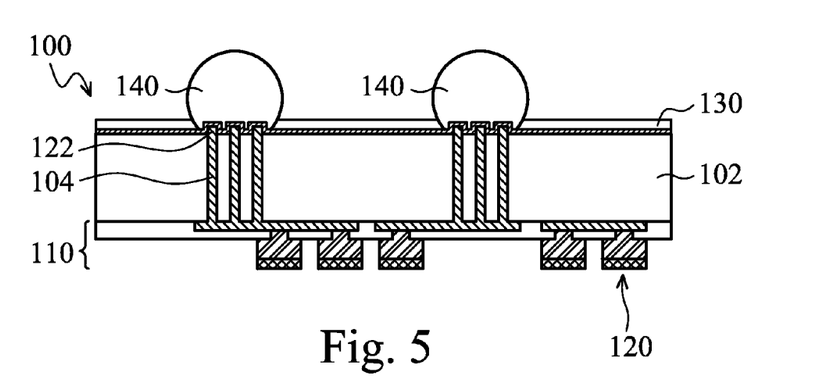

A plurality of conductive balls 140 is then formed over the seed layer 130 over the exposed portions 122 of the TSVs 104, as shown in FIG. 5. The conductive balls 140 are coupled to the seed layer 130 over the exposed portions 122 of the TSVs 104 using a ball drop process, for example. A direct ball drop process may be used, as an example, although alternatively, other methods may be used to couple the conductive balls 140 to the seed layer 130 over the exposed portions 122 of the TSVs 104. The conductive balls 140 comprise a eutectic material such as solder in some embodiments, for example. The conductive balls 140 are also referred to herein, e.g., in some of the claims, as solder balls. The conductive balls 140 may alternatively comprise other materials, other eutectic materials, or multiple layers or combinations thereof. A eutectic material of the conductive balls 140 is then reflowed by raising the temperature to the eutectic point of the eutectic material, to attach the conductive balls 140 to the seed layer 130 over the exposed portions 122 of the TSVs 104. For example, in embodiments wherein the conductive balls 140 comprise solder, the solder material of the conductive balls 140 may be raised to a peak temperature of about 260 degrees C. Alternatively, the reflow process may comprise other temperatures.

Figure 6:
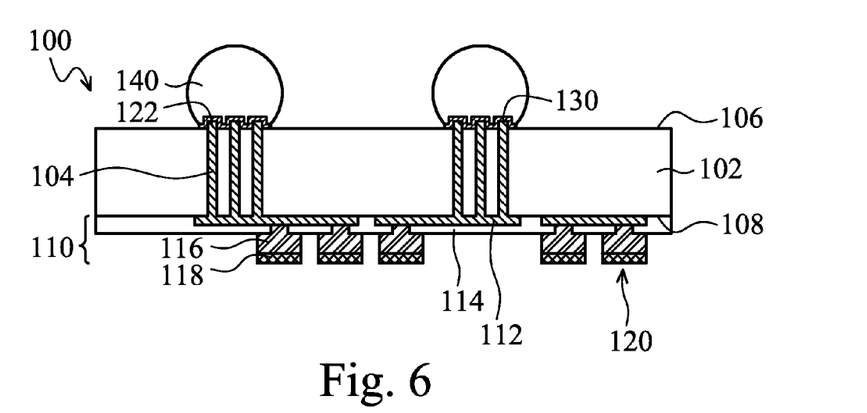

After the conductive balls 140 are coupled to the seed layer 130 over the exposed portions 122 of the TSVs 104, the seed layer 130 is removed from over the interposer substrate 102 top surface, as shown in FIG. 6. Advantageously, the conductive balls 140 are used as an etch mask for the removal of the seed layer 130 in some embodiments, so that a lithography process is not required to remove the seed layer 130. The seed layer 130 is etched using an etch process, using the conductive balls 140 as an etch mask during the etch process in some embodiments, for example.

In the embodiments illustrated in FIGS. 1 through 6, the conductive balls 140 are coupled to the interposer substrate 102 using a ball drop process. In accordance with other embodiments of the present disclosure, the conductive balls 140 are formed using a conductive paste 152, as shown in FIG. 7, and also shown in FIG. 9.

Figure 7:
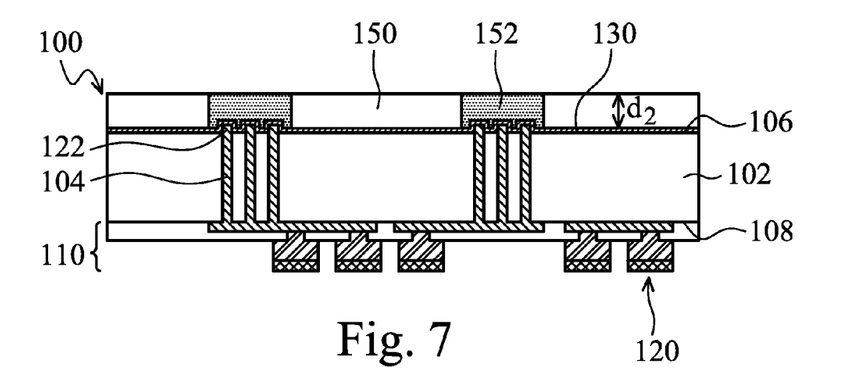
FIG. 7 is a cross-sectional view of a packaging device that illustrates a method of manufacturing a packaging device in accordance with other embodiments.

FIG. 7 is a cross-sectional view of a packaging device 100 illustrating a method of manufacturing a packaging device 100 in accordance with other embodiments. After a seed layer 130 is formed as illustrated in FIG. 4, a conductive paste 152 disposed within a stencil material 150 is formed over the seed layer 130, as shown in FIG. 7. The conductive paste 152 comprises a solder paste in some embodiments, as an example. The stencil material 150 comprises a polymer, steel, an Al alloy, an Mg alloy, or multiple layers or combinations thereof in some embodiments. Alternatively, the stencil material 150 and the conductive paste 152 may comprise other materials. The stencil material 150 and the conductive paste 152 comprise a thickness comprising dimension $d_2$, wherein dimension $d_2$ comprises about 60 to 100 μm in some embodiments. Alternatively, dimension $d_2$ of the stencil material 150 and the conductive paste 152 may comprise other materials and dimensions. The stencil material 150 comprises a sacrificial material and is adapted to control the shape and pattern of the conductive paste 152, for example.

The stencil material 150 is removed, and the conductive paste 152 is subjected to a reflow process to cause a eutectic material of the conductive paste 152 to reflow and form a conductive ball 140 over the exposed portions 122 of the TSVs 104 (e.g., over the seed layer 130 over the exposed portions 122), leaving the structure shown in FIG. 5. The stencil material 150 may be reused in a subsequent manufacturing process for an additional lot or batch of packaging devices 100 in some embodiments. Alternatively, the stencil material 150 may be discarded. In some embodiments, the stencil material 150 is removed during the reflow process for the conductive paste 152. In other embodiments, a separate etch process or removal process is used to remove the stencil material 150. The seed layer 130 is then removed from over the top surfaces of the interposer substrate 102 using the conductive balls 140 as an etch mask, as described for the previous embodiments and as shown in FIG. 6.

Figure 8:
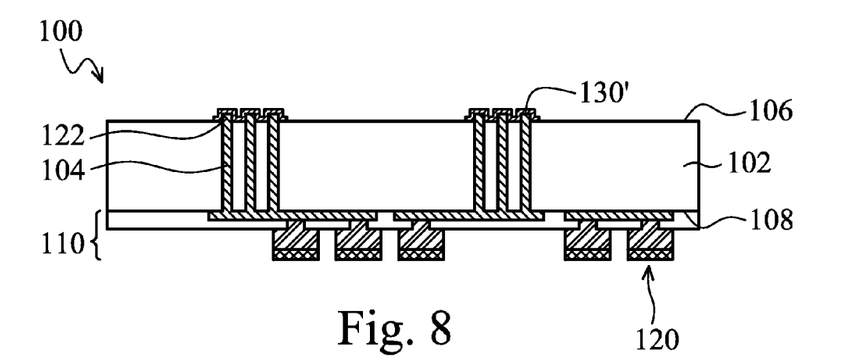
FIGS. 8 through 10 are cross-sectional views of a packaging device at various stages, illustrating a method of manufacturing a packaging device in accordance with other embodiments.
Figure 9:
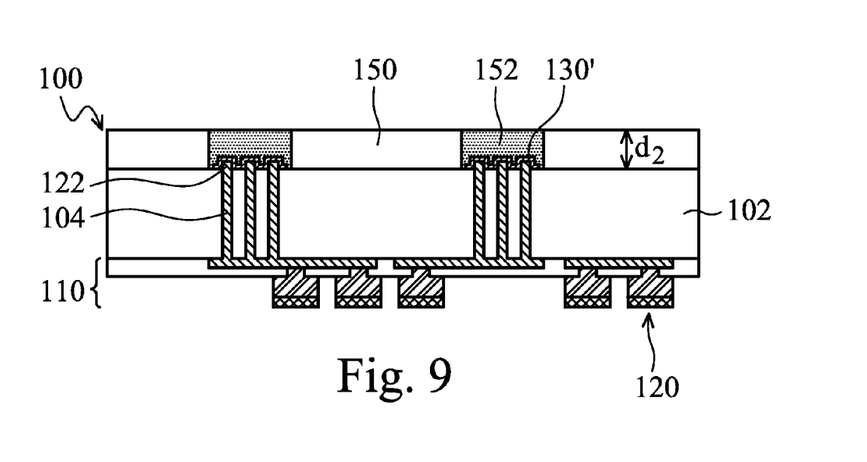
Figure 10:
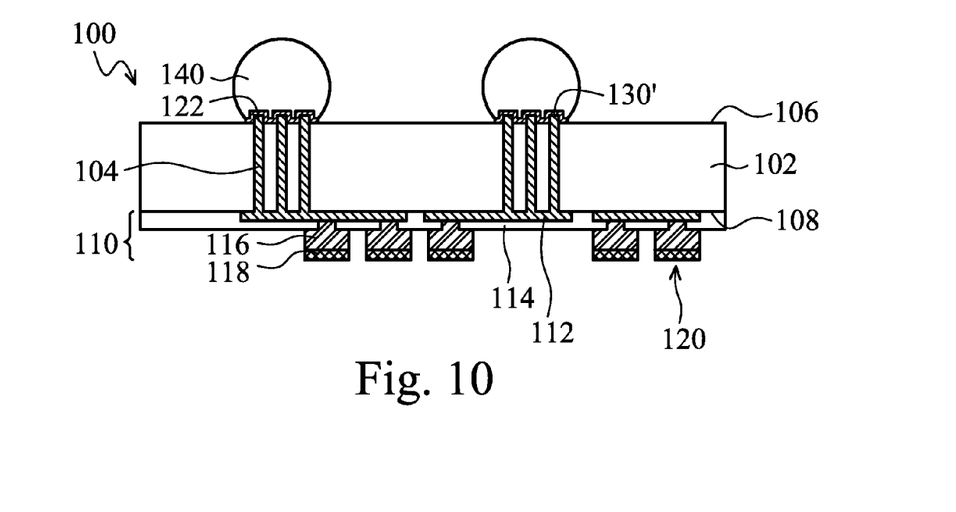

FIGS. 8 through 10 are cross-sectional views of a packaging device 100 at various stages illustrating a method of manufacturing a packaging device 100 in accordance with other embodiments. Rather than forming a blanket seed layer 130 over the entire surface of the interposer substrate 102 as in the previous embodiments described herein, after recessing the interposer substrate 102 and/or increasing the thickness of the TSVs 104 as shown in FIG. 3, a seed layer 130' is plated onto the exposed portions 122 of the TSVs 104, as shown in FIG. 8. The plating process results in the formation of the seed layer 130' only over the exposed portions 122 of the TSVs 104. The seed layer 130' is not formed over the top surface of the interposer substrate 102. The seed layer 130' comprises about 10 to 20 μm of Cu or Ni in some embodiments, as examples, although alternatively, the seed layer 130' may comprise other dimensions and materials. The plating process used to form the seed layer 130' may comprise an electro-less process in some embodiments, for example. Alternatively, other types of plating processes may be used to form the plated-on seed layer 130'.

A conductive paste 152 disposed within a stencil material 150 is formed over the seed layer 130', as shown in FIG. 9. A reflow process is used to reflow a eutectic material of the conductive paste 152 and form conductive balls 140, as shown in FIG. 10, and the stencil material 150 is removed. Advantageously, a separate etch process is not required to remove excess seed layer 130' material from over the top surface of the interposer substrate 102 in these embodiments.

In other embodiments, after the seed layer 130' is plated onto the exposed portions 122 of the TSVs 104 as shown in FIG. 8, conductive balls 140 are coupled to the seed layer 130' over the exposed portions 122 of the TSVs 104 using a direct ball drop process, as shown in FIG. 10.

Figure 11:
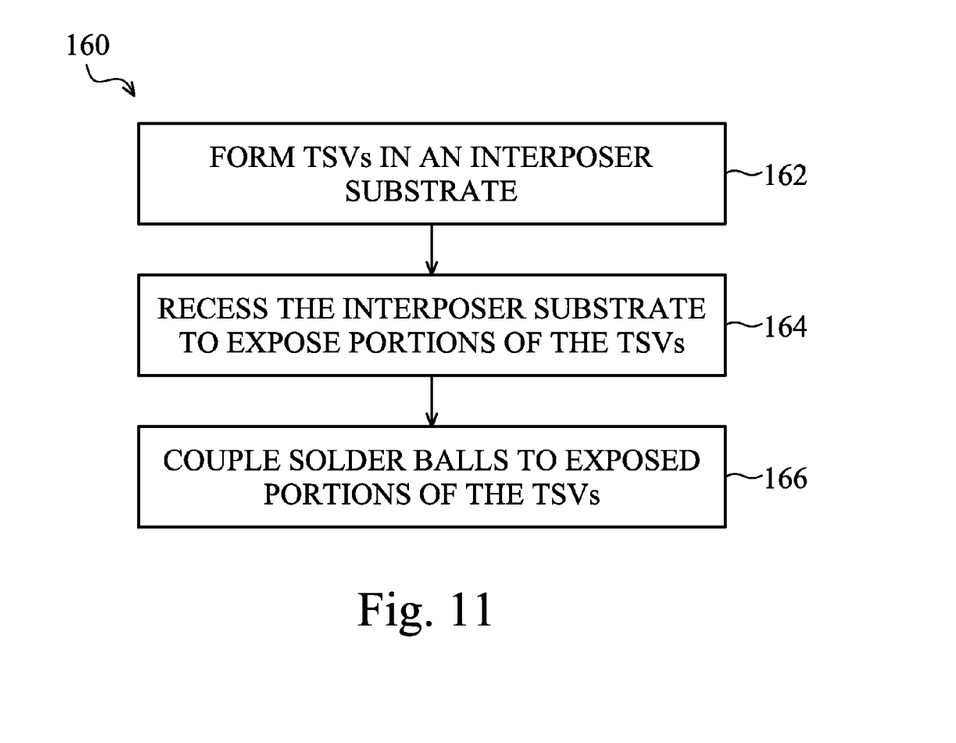
FIG. 11 is a flow chart of a method of manufacturing a packaging device in accordance with some embodiments.

FIG. 11 is a flow chart 160 of a method of manufacturing a packaging device 100 in accordance with some embodiments. In step 162, TSVs 104 are formed in an interposer substrate 102. In step 164, the interposer substrate 102 is recessed to expose portions 122 of the TSVs 104. In step 166, solder balls 140 are coupled to the exposed portions 122 of the TSVs 104.

Figure 12:
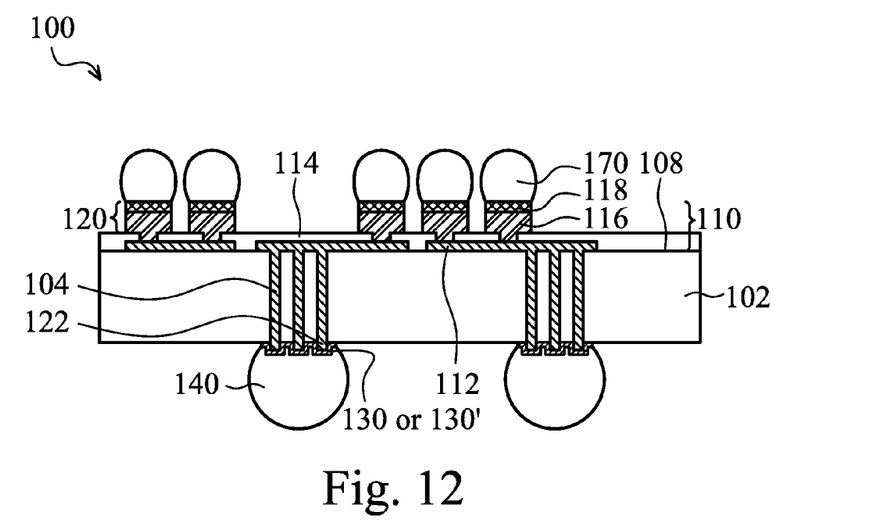
FIGS. 12 and 13 are cross-sectional views illustrating a method of attaching an integrated circuit die to a packaging device described herein.
Figure 13:
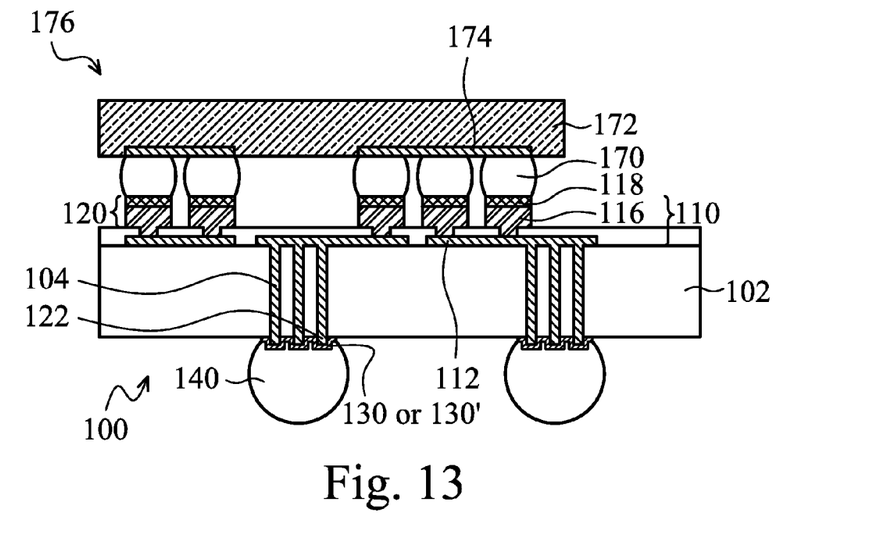

FIGS. 12 and 13 are cross-sectional views illustrating a method of attaching an integrated circuit die 172 to a packaging device 100 described herein. After the conductive balls 140 are formed on the portions 122 of the TSVs 104 using a method described herein with reference to FIGS. 1 through 10, a conductive bump 170 is formed on each contact 120 on the second side 108 of the interposer substrate 102, as shown in FIG. 12. The conductive bumps 170 are formed by a flip-chip process, wherein the conductive bumps 170 are attached to and are obtained from another die, and using a reflow process to attach the conductive bumps 170 to the contacts 120, for example. Alternatively, the conductive bumps 170 may be formed using other methods. The conductive bumps 170 comprise controlled collapse chip connection (C4) bumps in some embodiments, for example. The conductive bumps 170 comprise solder in some embodiments. Alternatively, the conductive bumps 170 may comprise other types of connections and materials.

An integrated circuit die 172 is then coupled to the conductive bumps 170 on the packaging device 100, forming a packaged semiconductor device 176, as shown in FIG. 13. Contacts 174 on the integrated circuit die 172 are aligned with the conductive bumps 170 on the packaging device 100 and are placed against the conductive bumps 170. A reflow process is used to attach the conductive bumps 170 to the contacts 174 on the integrated circuit die 172, for example. An underfill material (not shown) may be dispensed between the die 172 and the packaging device 100 in some embodiments, e.g., between the conductive bumps 170. The packaged semiconductor device 176 may then be used in an end application in some embodiments, by coupling the conductive bumps 140 to a substrate, printed circuit board (PCB), support, or other object.

Figure 14:
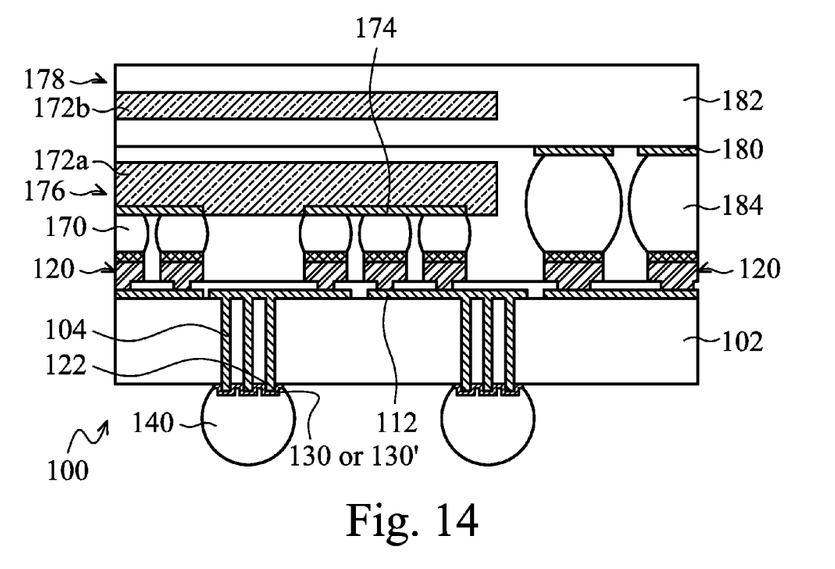
FIGS. 14 and 15 are cross-sectional views showing methods of using the packaging devices described herein in PoP devices in accordance with some embodiments.

The packaged semiconductor device 176 may be coupled to another packaged semiconductor device 178 to form a PoP device 198 in some embodiments, as shown in FIG. 14, which is a cross-sectional view of a portion of a PoP device 198 that illustrates a method of using the packaging devices 100 described herein in PoP devices 198. The packaged semiconductor device 176 including the novel packaging device 100 described herein comprises a first packaged semiconductor device or a bottom packaged semiconductor device. The packaged semiconductor device 176 is coupled to another packaged semiconductor device 178 which comprises a second packaged semiconductor device or a top packaged semiconductor device, for example. The packaged semiconductor devices 176 and 178 are coupled together by a plurality of solder joints 184 disposed about a perimeter of the packaged semiconductor devices 176 and 178. The solder joints 184 disposed between the packaged semiconductor devices 176 and 178 are arranged in one or more rows. The bottom packaged semiconductor device 176 includes an integrated circuit 172a coupled to the conductive bumps 170, as previously described herein. The top packaged semiconductor device 178 includes an integrated circuit die 172b. The package 182 of the top packaged semiconductor device 178 includes a plurality of contacts 180 disposed about the perimeter on a bottom surface thereof. The solder joints 184 couple the contacts 180 on the top packaged semiconductor device 178 to contacts 120 on the bottom packaged semiconductor device 176.

Figure 15:
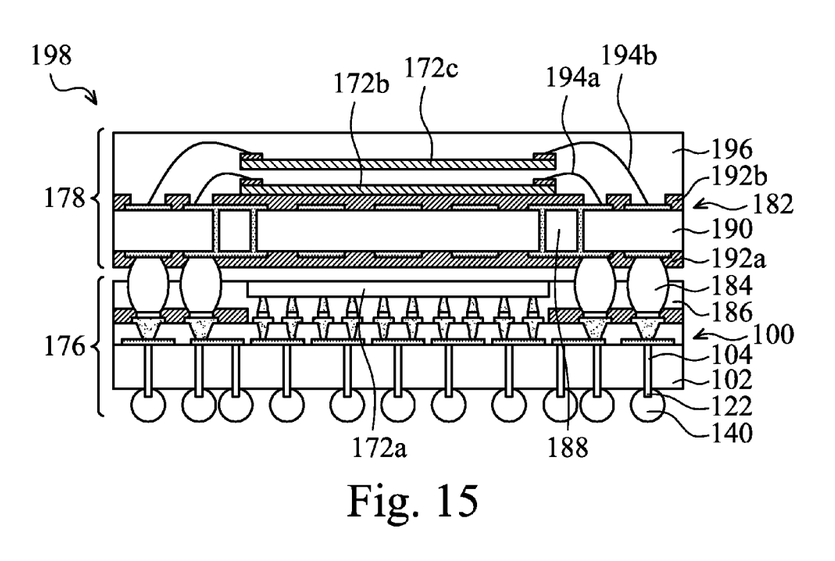

A more detailed view of a PoP device 198 implementing a novel packaging device 100 described herein is shown in FIG. 15 in a cross-sectional view. A molding compound 186 comprising an insulating material is disposed over the packaging device 100 after the solder joints 184 are formed, e.g., between the bottom packaged semiconductor device 176 and the top packaged semiconductor device 178. The molding compound 186 is not included in the PoP device 198 in some embodiments.

An example of a top packaged semiconductor device 178 that includes two integrated circuit dies 172b and 172c stacked vertically over the package 182 is shown. Alternatively, only one integrated circuit die 172b or 172c may be included in the top packaged semiconductor device 178. The package 182 includes a substrate 190 and a plurality of TSVs 188 formed therein that provide vertical connections for the top packaged semiconductor device 178. The package 182 includes a first RDL 192a on a bottom surface thereof and a second RDL 192b on a top surface thereof. The RDLs 192a and 192b provide horizontal connections for the top packaged semiconductor device 178. Integrated circuit die 172b is attached to a top surface of the package 182. Wire bonds 194a couple bond pads on the package 182 to bond pads on the integrated circuit die 172b. Integrated circuit die 172c is attached to a top surface of integrated circuit die 172b. Wire bonds 194b couple bond pads on the package 182 to bond pads on the integrated circuit die 172c. A molding compound 196 is formed over the integrated circuit die 172c and exposed portions of the package 182. The molding compound 196 comprises an insulating material that protects the wire bonds 194a and 194b, for example.

In some embodiments, the integrated circuit dies 172b and 172c are packaged on the substrate 182 of the top packaged semiconductor device 178 using a flip-chip wafer level packaging (WLP) technique and wire-bonding process, for example. Alternatively, the top packaged semiconductor device 178 may include one or more integrated circuit dies 172b or 172c that are packaged in other types of packaging systems or configurations.

In the previous embodiments shown and described herein, each conductive ball 140 is coupled to a plurality of TSVs 104. As an example, in FIG. 10, the conductive balls 140 are coupled to exposed portions 122 of three TSVs 104. In other embodiments, each conductive ball 140 can be coupled to exposed portions 122 of two TSVs 104, or to exposed portions 122 of four or more TSVs 104, not shown in the figures. In other embodiments, each conductive ball 140 is coupled to an exposed portion 122 of only one of the TSVs 104, which is illustrated in FIG. 15.

The conductive balls 140 of the present disclosure are arranged in a ball grid array (BGA) arrangement in some embodiments, for example. The conductive balls 140 may be arranged in a fully populated array or matrix on the first side 106 of the interposer substrate 102 in some embodiments. Alternatively, the conductive balls 140 may be arranged only in central regions of the interposer substrate 102, only in one or more rows in a perimeter region of the interposer substrate 102, or in a combination of the central region and the perimeter region of the interposer substrate 102. In some embodiments, the conductive balls 140 may be arranged in a random pattern. The conductive balls 140 may alternatively be arranged in other configurations and patterns.

Embodiments of the present disclosure include methods of manufacturing the packaging devices 100, and also include packaging devices 100 manufactured using the methods described herein. Embodiments of the present disclosure also include packaged semiconductor devices 176 that have been packaged using the novel packaging devices 100 described herein. Embodiments of the present disclosure also include PoP devices 198 that include the novel packaging devices 100 described herein. Embodiments of the present disclosure further include methods of coupling solder balls 140 to packaging substrates.

Advantages of embodiments of the disclosure include providing novel packaging devices 100 that do not require an under-ball metallization (UBM) structure for forming solder balls on a surface thereof, which dramatically reduces manufacturing costs and time, and provide very low-cost packaging devices 100. UBM structures used in traditional packaging systems are costly to manufacture and require expensive processing steps, such as photolithography, deposition, and patterning of several material layers. The methods of coupling the conductive balls 140 to the exposed portions 122 of the TSVs 104 of the packaging devices 100 described herein advantageously do not require photolithography process steps and thus provide reduced costs. Because a UBM structure is not required on the conductive ball 140 side of the packaging device 100, the thickness of the packaging devices 100 is reduced, resulting in the ability to produce PoP devices 198 with a reduced overall thickness and a space savings.

The conductive balls 140 are used as an etch mask during the removal of a seed layer 130 in some embodiments, further eliminating the need for photolithography process in the manufacturing process flow for the packaging devices 100. Furthermore, the novel packaging device 100 structures and manufacturing methods are easily implementable in manufacturing process flows.

In accordance with some embodiments of the present disclosure, a method of manufacturing a packaging device includes forming a plurality of TSVs in an interposer substrate. The method includes recessing the interposer substrate or increasing a thickness of the plurality of TSVs to expose portions of the plurality of TSVs. A conductive ball is coupled to the exposed portion of each of the plurality of TSVs.

In accordance with other embodiments, a packaging device includes an interposer substrate and a plurality of TSVs disposed in the interposer substrate. The interposer substrate is recessed below top surfaces of the plurality of TSVs. A conductive ball is coupled to each of the plurality of TSVs.

In accordance with other embodiments, a method of coupling a plurality of solder balls to a packaging substrate includes providing the packaging substrate, the packaging substrate comprising an interposer substrate and a plurality of TSVs disposed within the interposer substrate. The method includes recessing the interposer substrate or increasing a thickness of the plurality of TSVs to expose portions of the plurality of TSVs, and forming a seed layer over the exposed portions of the plurality of TSVs. A solder ball is coupled to the seed layer over the exposed portions of each of the plurality of TSVs.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a packaging device, the method comprising:
forming a plurality of via structures in a substrate, each of the vias including multiple through-substrate vias (TSVs) with protruding portions extending away from a major surface of the substrate;
forming a seed layer over the protruding portions of the multiple TSVs; and
coupling a conductive ball to the seed layer and the protruding portions of the multiple of the of TSVs, wherein the seed layer and the protruding portions of the multiple TSVs of extend into an interior region of the conductive ball.

2. The method of claim 1, wherein the forming the seed layer comprises forming the seed layer over the major surface of the substrate and over the protruding portions of the plurality of TSVs, and wherein the method further comprises removing portions of the seed layer over the major surface of the substrate using the conductive ball as an etch mask.

3. The method of claim 2, wherein the forming the seed layer comprises a sputter process.

4. The method of claim 1, wherein the forming the seed layer comprises selectively plating the seed layer over the protruding portions of the plurality of TSVs relative to the major surface of the substrate.

5. The method of claim 1, wherein the forming the plurality of TSVs comprises:
providing the substrate having the plurality of TSVs therein, each of the plurality of TSVs having a distal surface substantially co-planar with the major surface of the substrate; and
recessing the major surface of the substrate relative to the distal surfaces of the plurality of TSVs.

6. The method of claim 5, wherein the recessing the major surface of the substrate comprises at least one of a chemical-mechanical polish process or an etch process.

7. The method of claim 1, wherein the forming the plurality of TSVs comprises:
providing the substrate having the plurality of TSVs therein, each of the plurality of TSVs having a distal surface substantially co-planar with the major surface of the substrate; and
forming conductive material on the distal surfaces of the plurality of TSVs.

8. The method of claim 7, wherein the forming conductive material on the distal surfaces of the plurality of TSVs comprises at least one of a plating process or a deposition process.

9. The method of claim 1, wherein the coupling the conductive ball to seed layer and the protruding portion of each of the plurality of TSVs comprises using a ball drop process to attach the conductive ball to the seed layer and the protruding portion of each of the plurality of TSVs, and reflowing a eutectic material of the conductive ball.

10. The method of claim 1, wherein the coupling the conductive ball to the seed layer and the protruding portion of each of the plurality of TSVs comprises forming a conductive paste disposed within a stencil material, the stencil material disposed over the major surface of the substrate, the conductive paste disposed over the seed layer and the protruding portions of the plurality of TSVs.

11. A method of manufacturing a packaging device, the method comprising: forming a plurality of through-substrate vias (TSVs) within an interposer, the plurality of TSVs having a multiple protruding portions extending away from a first major surface of the interposer, the plurality of TSVs electrically coupled to a redistribution layer disposed at a second major surface of the interposer opposite the first major surface; and forming a single solder element over the multiple protruding portions of the plurality of TSVs, the multiple protruding portions extending into a portion of the single solder element.

12. The method of claim 11, further comprising:
forming a second plurality of TSVs within the interposer, each of the second plurality of TSVs having a protruding portion extending away from the first major surface of the interposer, the second plurality of TSVs electrically coupled to the redistribution layer disposed at the second major surface of the interposer opposite the first major surface; and
forming a second single solder element over the protruding portions of all of the second plurality of TSVs, the protruding portions extending into a portion of the second single solder element.

13. The method of claim 11, wherein the forming the solder element comprises coupling one solder element to the plurality of the TSVs, the plurality of TSVs extending to a portion of the one solder element.

14. The method of claim 11, wherein the forming the plurality of TSVs within the interposer comprises:
forming a plurality of apertures extending completely through the interposer;
filling the apertures with a conductive material, the conductive material having a distal surface substantially co-planar with a first major surface of the interposer; and
recessing the interposer or increasing a thickness of the plurality of TSVs to form the protruding portion of each of the plurality of TSVs.

15. The method of claim 11, further comprising coupling an integrated chip to the redistribution layer, the integrated chip disposed at a second major surface of the interposer.

16. The method of claim 11, wherein the solder element comprises a solder ball.

17. A method of manufacturing a packaging device, comprising:
forming multiple through substrate vias (TSV) extending from a first surface of an interposer substrate to a second surface of the interposer substrate;
forming a redistribution layer (RDL) in electrical contact with respective first ends of the multiple TSVs and over the first surface of the interposer substrate;
increasing a relative distance between an end surface of respective second ends of the multiple TSVs and the second surface of the interposer substrate;
forming a seed layer over the multiple TSVs; and
encapsulating a portion of the seed layer and the respective second ends of the multiple TSVs in a common connector element.

18. The method of claim 17, wherein the step of forming at least one through substrate via (TSV) extending from a first surface of an interposer substrate to a second surface of the interposer substrate includes;
drilling at least one hole through an interposer substrate; and
filling the at least one hole with conductor material.

19. The method of claim 17, wherein the step of increasing a relative distance between an end surface of a second end of the at least one TSV and the second surface of the interposer substrate includes recessing the second surface of the interposer substrate, increasing a thickness of the at least on TSV, or both.

20. The method of claim 17, wherein the step of encapsulating a portion of the seed layer and the respective second ends of the multiple TSVs in a common connector element includes a direct ball drop process using a solder ball as the connector element.

* * * * *